US009325359B2

(12) United States Patent
Gander et al.

(10) Patent No.: US 9,325,359 B2
(45) Date of Patent: Apr. 26, 2016

(54) RADIOFREQUENCY SIGNAL SETTING REACHING A CONDITION OF JAMMING OR CLIPPING

(71) Applicant: ST-Ericsson SA, Plan-les-Ouates (CH)

(72) Inventors: Martial Gander, Les Arcs sur Argens (FR); Marten Myrehed, Lund (SE)

(73) Assignee: ST-ERICSSON SA, Plan-les-Ouates (CH)

( * ) Notice: Subject to any disclaimer, the term of this patent is extended or adjusted under 35 U.S.C. 154(b) by 0 days.

(21) Appl. No.: 14/413,125

(22) PCT Filed: Jul. 1, 2013

(86) PCT No.: PCT/EP2013/063860
§ 371 (c)(1),
(2) Date: Jan. 6, 2015

(87) PCT Pub. No.: WO2014/009196
PCT Pub. Date: Jan. 16, 2014

(65) Prior Publication Data
US 2015/0207529 A1 Jul. 23, 2015

Related U.S. Application Data

(60) Provisional application No. 61/679,151, filed on Aug. 3, 2012.

(30) Foreign Application Priority Data

Jul. 9, 2012 (EP) ..................................... 12305820

(51) Int. Cl.
*H04B 7/00* (2006.01)
*H04B 1/10* (2006.01)
(Continued)

(52) U.S. Cl.
CPC ........... *H04B 1/1027* (2013.01); *H03G 3/3052* (2013.01); *H03M 1/185* (2013.01)

(58) Field of Classification Search
CPC ............................ H04B 17/309; H04B 17/345
USPC .......... 455/234.1, 114.2, 115.1, 226.1, 245.1, 455/67.11, 278.1, 296; 375/346, 345
See application file for complete search history.

(56) References Cited

U.S. PATENT DOCUMENTS 6,968,166 B2 * 11/2005 Yang .................... H03G 3/3036
455/226.1
2002/0183028 A1 * 12/2002 Takahashi ............ H03G 3/3052
455/232.1

(Continued)

FOREIGN PATENT DOCUMENTS

EP          1 156 590 A1    11/2001

OTHER PUBLICATIONS

International Search Report issued in corresponding International application No. PCT/EP2013/063860, date of mailing Jan. 17, 2014.
(Continued)

*Primary Examiner* — Sonny Trinh
(74) *Attorney, Agent, or Firm* — Patent Portfolio Builders PLLC

(57) ABSTRACT

A method of setting a Radiofrequency, RF, signal level in a RF receiver comprising: estimating an error of the signal level due to signal level reaching a condition of jamming or clipping by correlating the signal level with a point of a characterization curve of jamming condition or with a point of a characterization curve of clipping condition (300), respectively; correcting the RF signal level based on the error; and, wherein: each of the characterization curves comprises a plurality of points comprising first points determined in a previously performed characterization at a point of measurement and groups of second points stepped between pairs of adjacent first points, said plurality of first points including at least three points defining at least two sections of the characterization curve.

16 Claims, 5 Drawing Sheets

(51) Int. Cl.
*H03G 3/30* (2006.01)
*H03M 1/18* (2006.01)

(56) References Cited

U.S. PATENT DOCUMENTS

2003/0139160 A1 7/2003 Yang
2004/0063413 A1 4/2004 Schaffer et al.

OTHER PUBLICATIONS

Written Opinion of the International Searching Authority issued to corresponding International application No. PCT/EP2013/063860, date of mailing Jan. 17, 2014.
Extended European Search Report issued in corresponding European patent application No. EP 12 30 5820, date of completion of the the search Dec. 5, 2012.

* cited by examiner

RADIOFREQUENCY SIGNAL SETTING REACHING A CONDITION OF JAMMING OR CLIPPING

TECHNICAL FIELD

The proposed solution relates to wireless communications and, more particularly, to a method, an apparatus, a receiver and a wireless device for setting a Radiofrequency (RF) signal reaching a condition of jamming or clipping.

BACKGROUND

Nearly every type of RF communication receiver has some kind of Automatic Gain Control (AGC) feature to adjust the gain of the RF chain to an optimal level based on RF signal strength e.g. at the input of the receiver. The AGC is adapted to keep the output signal level substantially constant irrespective of the increase or decrease in the level of the received signal. In fact, at the receiver, the input signal generally varies over a given dynamic range. This may be due to variation of channel conditions or to the source of the received signal moving away from the receiver (e.g., a mobile handset being operated in a fast driven car).

Additionally, components such as an analog-to-digital converter (ADC) are built with an input capability limited by the number of bits at the output (also known as "bitwidth"), hence limiting the dynamic range of input signals acceptable by the receiver. Therefore, without AGC feature, the input dynamic range of the ADC would limit the receiver that would either be saturated with large signals (also known as "clipping") or be below a tolerable noise level (also known as "jamming") leading to poor performances.

High and low input signals fed to an RF Digital Front End (DFE) circuit need to be properly measured so that proper gain is applied, for instance, at the input of the ADC. State of the art AGC loops use fixed signal level threshold to assess jamming condition or clipping condition. If a signal level is found below a predetermined low signal threshold level then the gain is set e.g. between its maximum value and a value corresponding to half of the dynamic gain range. On the other hand, if a high signal level is found above a predetermined high signal threshold the gain would be set between its minimum value and half of the dynamic gain range.

Unfortunately, state of the art mechanisms show weaknesses at limit of jamming and clipping since they apply same gain to a range of signals at proximity of these thresholds. Therefore, improper gain, i.e. gain higher than required, may be applied to signals leading to degradation of the Signal-to-Noise Ratio (SNR) downstream in the RF chain, e.g. a RF mixer and/or a Intermediate Frequency (IF) stages, and thus at the input of the demodulator in the baseband (BB) unit.

More importantly, the state of the art mechanism estimates blindly the gain because the AGC has no information of how far the signal saturates the ground floor. Hence the estimated gain may be inducing the signal to saturate or jam.

SUMMARY

This problem may be overcome by accurately setting the signal at limit of jamming or clipping using a characterization curve of jamming condition or clipping condition.

Indeed, a first aspect proposes a method of setting a Radiofrequency, RF, signal level in a RF receiver comprising the step of estimating an error of the signal level due to signal level reaching a condition of jamming or clipping by correlating the signal level with a point of a characterization curve of jamming condition or with a point of a characterization curve of clipping condition, respectively. The method further comprises the step of correcting the measured RF signal level based on the error, wherein each of the characterization curves comprises a plurality of points comprising first points determined in a previously performed characterization at a point of measurement and groups of second points stepped between pairs of adjacent first points, the plurality of first points including at least three points defining at least two sections of the characterization curve. This method allows an easy implementation as most of the required data for its implementation are available in a database at the time of operation.

A second aspect relates to an apparatus for setting a Radiofrequency, RF, signal level in a RF receiver comprising a correlating unit configured to estimate an error of the signal level due to signal level reaching a condition of jamming or clipping by correlating the signal level with a point of a characterization curve of jamming condition (200) or with a point of a characterization curve of clipping condition, respectively. The apparatus further comprises a correcting unit configured to correct the RF signal level based on the error, wherein each of the characterization curves comprises a plurality of points comprising first points determined in a previously performed characterization at a point of measurement and groups of second points stepped between pairs of adjacent first points, the plurality of first points including at least three points defining at least two sections of the characterization curve. This apparatus allows an easy implementation as it does only require the addition one ore more correcting unit to legacy receiver architecture.

A third aspect relates to a method of setting a Radiofrequency, RF, signal level in a RF receiver comprising the step of obtaining a measured RF signal level reaching a condition of jamming or clipping at the output of a signal processing system such as an Analog to Digital Converter (ADC). The method further comprises the step of estimating the RF signal level based on at least the measured RF signal level and a sum of known gain values associated to the measured RF signal.

A fourth aspect relates to an apparatus for setting a Radiofrequency, RF, signal level in a RF receiver comprising an estimation unit configured to estimate the RF signal level based on at least a measured RF signal level reaching a condition of jamming or clipping at the output of a signal processing system such as an Analog to Digital Converter (ADC) and a sum of known gain values associated to the measured RF signal.

A fifth aspect relates to a receiver for a wireless communication network comprising an apparatus as defined in the second aspect of the proposed solution. The proposed receiver is thus able to manage larger dynamic range of received signals.

A sixth aspect relates to a wireless device comprising a receiver as defined in the third aspect of the proposed solution Thus, in a receiver embodying the principles of such mechanism, weaknesses of state of the art mechanism reaching a condition of jamming or clipping are overcome by accurately estimating the received signal strength indication (RSSI) measurement at the input of the receiver by using a previously determined characterization curve of jamming condition or clipping condition in order to apply the proper gain at, at least, one of the downstream stages, either the DFE (Digital Front End), the AFE (Analogue Front End) or both, therefore leading to amelioration of SNR at the input of the demodulator in the baseband unit.

In one embodiment, the plurality of points of the characterization curve is stored in a look-up table. This saves a lot of space on the receiver.

In accordance with the proposed the groups of second points of the characterization curve are obtained from the first points using a curve fitting algorithm. This is one of the easiest ways to find the parameter values that most closely match the characterization data.

If desired, the curve fitting may be determined by using an approximation method such as Least-Squares method. This allows quick implementation as the generated curve does not pass through one or more of the plurality of points.

In accordance with the proposed solution, the curve fitting is determined by using an interpolation algorithm such as Cubic Spline, Lagrange or Newton interpolation methods. This allows precise implementation as the generated curve passes through all of the plurality of points.

In another embodiment, the operation of correcting the RF signal level based on the error is performed before analog-to-digital converting the RF signal.

BRIEF DESCRIPTION OF THE DRAWINGS

A more complete understanding of the proposed solution may be obtained from a consideration of the following description in conjunction with the drawings, in which.

DETAILED DESCRIPTION OF EMBODIMENTS

Figure 1:
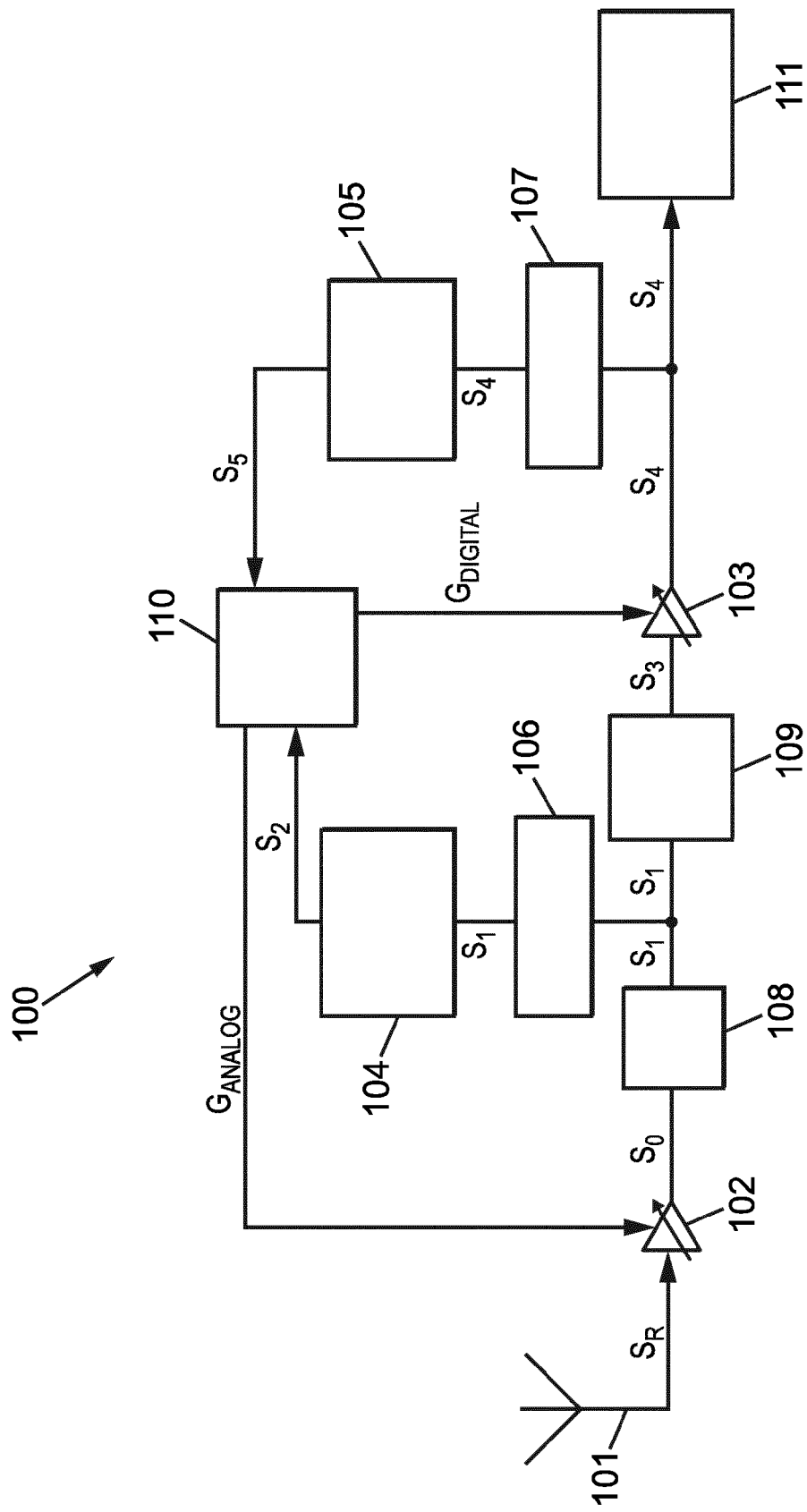
FIG. 1 is a block diagram illustrating an exemplary implementation of a receiver.

FIG. 1 is a block diagram illustrating an exemplary implementation of a RF receiver 100.

Referring to FIG. 1, there is shown the receiver 100 comprising an antenna 101 adapted to receive a modulated RF signal, and a BB unit 111 comprising a demodulator adapted to retrieve data from the modulated RF signal. The receiver further comprises a RF chain between the antenna 101 and the BB unit 111. The RF chain comprises a direct path with a first digital gain unit 102 such as a variable gain amplifier, followed by an ADC 108, a digital channel filter 109 and a second digital gain unit 103 such as a variable gain amplifier. The receiver further comprises a control path, with first and second measurement blocks 106 and 107, respectively, first and second correlating units 104 and 105, respectively and an Automatic Gain Control (AGC) circuit 110.

Referring to FIG. 1, an input signal $S_R$ is received at the antenna 101, then a gain $G_{ANALOG}$ defined by the AGC circuit 110 is applied onto the input signal $S_R$ using the variable gain amplifier 102, thus generating a signal $S_0$. Signal $S_0$ is then fed to the ADC 108. The measurement block 106 is arranged to measure the signal $S_1$ at the output the ADC 108. In case where the measured power level of signal $S_1$ is below the jamming threshold or above the clipping threshold of the receiver 100, for instance because of limited ADC 108 bit-width or existence of a significant noise floor level, the correlating unit 104 is activated to estimate a measurement error for signal $S_1$ by correlating the power level of signal $S_1$ with a point of the characterization curve of jamming condition or with a point of the characterization curve of clipping condition.

Characterization curves may have been determined in a previously performed characterization, for instance by experimentation or during simulations in laboratory. Therefore, by applying the estimated measurement error to the power level of signal $S_1$, a signal $S_2$ is created and then fed at the input of the AGC circuit 110. Furthermore, the AGC circuit 110 uses signal $S_2$ to derive a gain $G_{ANALOG}$ which is then applied to the input signal $S_R$.

In case where power level of signal $S_1$ equals or is below a constant predetermined power level at the point of measurement of measurement block 106, signal $S_1$ is further filtered by the digital channel filter 109, thus generating a signal $S_3$. Then, a gain $G_{DIGITAL}$ defined by the AGC circuit 110 is applied onto the signal $S_3$ through the variable gain amplifier 103, thus generating a signal $S_4$.

At the output of variable gain amplifier 103, the measurement block 107 is arranged to measure the signal $S_4$. In case where the measured power level of signal $S_4$ is is below the jamming threshold or above the clipping threshold of the receiver 100, for instance because of limited ADC 108 bit-width or existence of a significant noise floor level, the correlating unit 105 is activated to estimate a measurement error of signal $S_4$ by correlating the power level of signal $S_4$ with a point of the characterization curve of jamming condition or with a point of the characterization curve of clipping condition.

Characterization curves may have been determined in a previously performed characterization for instance by experimentation or during simulations in laboratory. Therefore, by applying the estimated measurement error to the power level of signal $S_4$, a signal $S_5$ is created and then fed to the input of the AGC circuit 110. Furthermore, the AGC circuit 110 uses signal $S_5$ to derive a gain $G_{DIGITAL}$ which is then applied onto the signal $S_3$ through the variable gain amplifier 103. In case where power level of signal $S_4$ equals or is below a constant predetermined signal level at the point of measurement of measurement block 107, signal $S_4$ is sent to the baseband unit 111 for further processing, which may include signal demodulation to retrieve useful data.

Another solution may be envisaged to improve S4 signal output power measurement accuracy. The solution would replace the existing curve fitting based correlation unit 105 with an estimation unit (not shown in figures). The object of this unit is to estimate S4 signal power from the measured ADC output power value done in unit 106. The estimation can be accurately done if the gain difference between signal point S1 and S4 is known. In principle, the gain difference is perfectly known. Finally, S4 signal power can be accurately computed as follows:

$$S4\_signal\_power\_estimation = S1\_signal\_power + channel\_filter\_gain + digital\_gain \quad (1)$$

In formula (1) S4_signal_power_estimation corresponds to the estimated output power of the digital gain unit 103 expressed in dB, S1_signal_power corresponds to the ADC 108 output signal power in dB, channel_filter_gain: corresponds to the channel filter gain in dB of digital channel filter 109 and digital_gain corresponds to the digital gain of the variable gain amplifier 103, applied at the instant the measure is estimated.

This solution can proceed even though the signal is saturating/jamming at the ADC output. In that case the signal power S1 (S1_signal_power) would be the power estimation proceeded according to correlation unit 104 described previously.

This solution would be activated only if the signal S4 or S1 is saturating or jamming.

Figure 2:
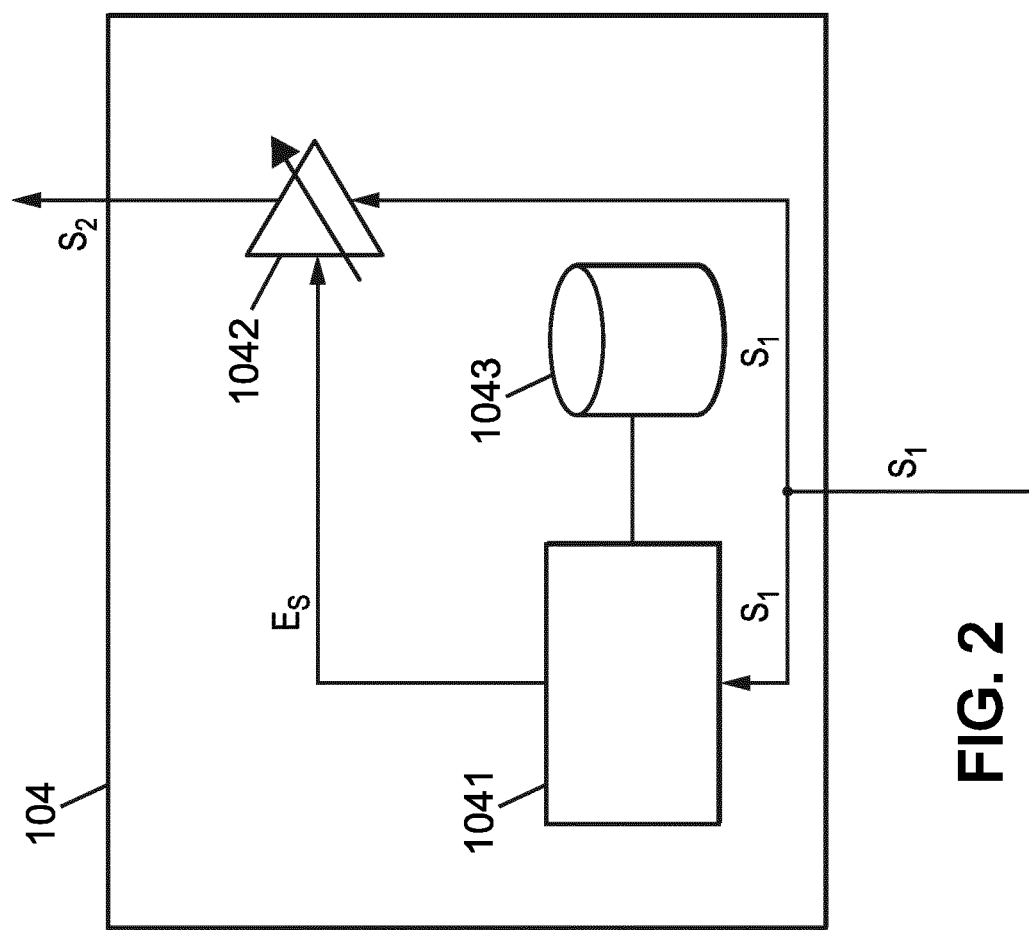
FIG. 2 is a block diagram illustrating an exemplary implementation of a correlating unit corresponding to an embodiment of the proposed solution.

FIG. 2 is a block diagram illustrating an exemplary implementation of a correlating unit 104 corresponding to an embodiment of the proposed solution. Referring to FIG. 2, there is shown therein an estimator 1041, a database 1043 and a variable gain amplifier 1042.

Referring to FIG. 2, a signal $S_1$ received at the input of the correlating unit 104 is sent to the estimator 1041 which is responsible for estimating a measurement error $E_s$ of the power level of the received signal $S_1$. Such error may be due to power level of signal $S_1$ being below the jamming threshold or above the clipping threshold of the receiver 100 by correlating the power level of signal received signal $S_1$ with a point of the characterization curve of jamming condition or of the characterization curve of clipping condition, respectively. The characterization curve may be stored in a look-up table contained in the database 1043. At the output of estimator 1041, measurement error $E_s$ is further mixed by the variable gain amplifier 1042 with the received signal $S_1$, thus generating a signal $S_2$ which is further sent, for instance, to the input of the AGC circuit 110.

The proposed solution relies on the ability of estimator 1041 to estimate the input signal $S_R$ that is received at the antenna 101 even though it is clipping or it is being jammed. This proper estimation enables the AGC circuit 110 to generate an appropriate gain $G_{ANALOG}$ or $G_{DIGITAL}$ that is applied at the analog or digital front-end, respectively, that is to say upstream or downstream of the ADC 108.

The estimation carried out by the estimator 1041 is based on a characterization curve, which may be different for jamming and clipping conditions. In fact, jamming phenomenon occurs mainly in the digital front-end while clipping often happens first at the ADC 108 input but can also be identified in the digital front-end at the filter stages 109. Thus, the points of measurements for both jamming and clipping in order to create the characterization curve may be differently located in the receiver 100. Referring to FIG. 1, points of measurements are defined by the measurement blocks 106 and 107. Measurement block 106 may be used for measurements needed for characterization curve for clipping conditions, while measurement block 107 may be used for measurements needed for characterization curve for jamming conditions. But, in another embodiment, a point of measurement could be placed right after the filter 109, where a variable gain amplifier such 102 and 103 would be located just before the filter 109.

A RF signal of 3G or 4G technology may be modelled with a white Gaussian signal with different Peak-to-Average Power Ratio (PAPR) within a range of 4 dB to 12 dB. In this case, the proposed solution and more particularly the characterization curve determination may be modelled as follows. The idea consists in measuring the error due to jamming or clipping of the white Gaussian signal at a point of measurement by calculating the difference between the power level of the white Gaussian signal with a given PAPR to the power level of the identical signal suffering from jamming or clipping. By doing so, it has been found that the error due to jamming or clipping is nearly identical for a given power level of the original white Gaussian signal whatever the PAPR. Thus, a single characterization curve may be used to characterise jamming condition or clipping conditions.

In order to save memory space used for storing the curves, the plurality of points of the characterization curve may be stored in a look-up table of a database 1043 as described in FIG. 2. In order to allow easier hardware implementation and reduce computational complexity, curve fitting of the characterization curve may be performed as well. Approximation method such as Least-Squares method or interpolation methods such as Cubic Spline, Lagrange or Newton methods may be used to determine the measurement error $E_s$ due to jamming condition or clipping conditions. The groups of second points as defined in the summary correspond the points generated by use of forgoing methods.

Figure 3:
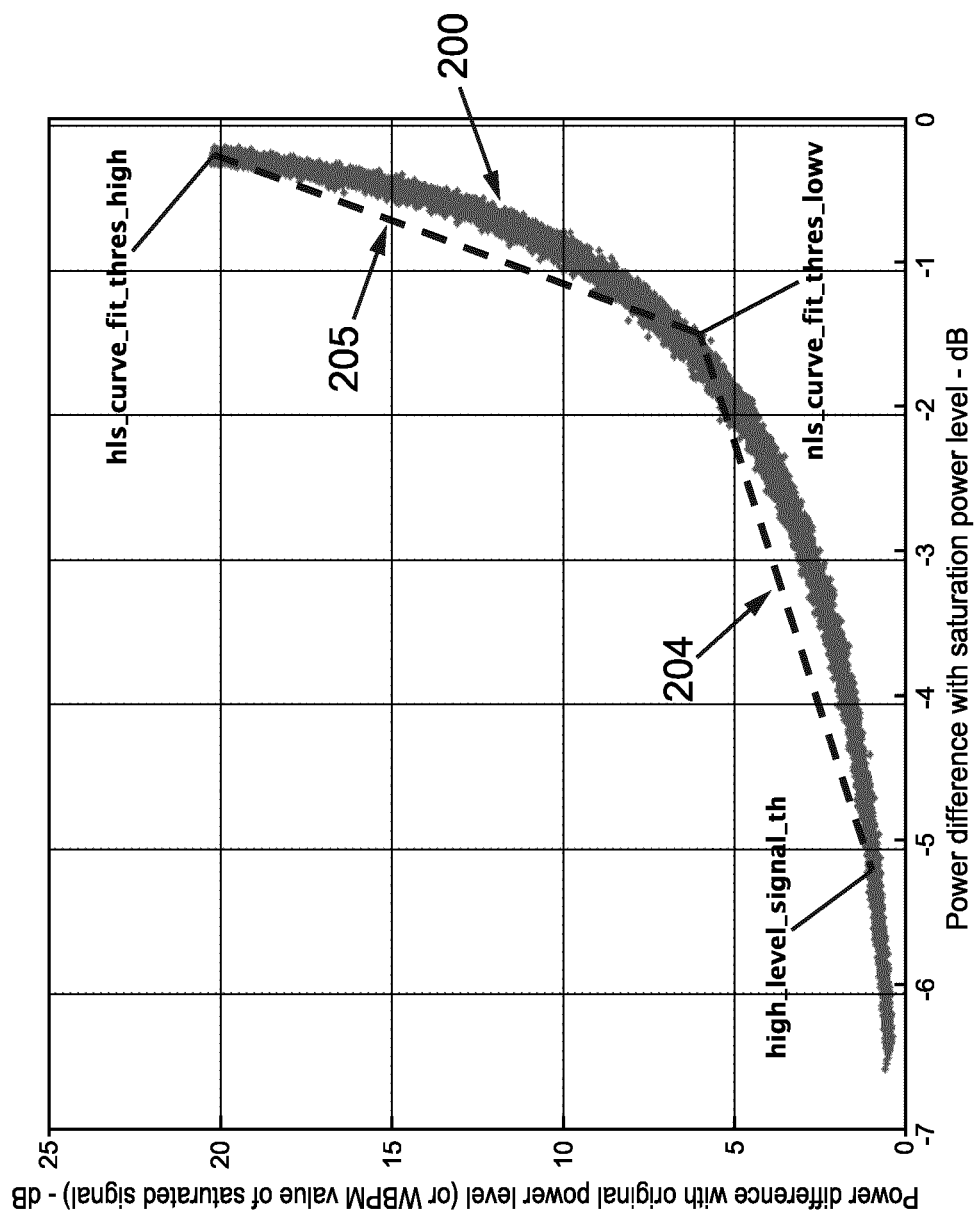
FIG. 3 is a graph illustrating an exemplary characterization curve at high limit of an input dynamic range.

Referring now to FIG. 3, there is shown therein a graph illustrating an exemplary characterization curve 200 of white Gaussian signals above a clipping threshold. A curve fitting using e.g. the Least-Squares method is also shown comprising two line segments 204 and 205. Abscissa of the graph, expressed in dB, shows a power level difference between the clipping power level of the receiver 100, in this example limited by the bitwidth of the ADC 108, with the power level of signal $S_1$ measured by the measurement block 106. In the abscissa, the reference power is the clipping power level set as 0 dB. Namely, at 0 dB the receiver is considered to be completely clipped (i.e. saturated). Ordinate of the graph, expressed also in dB, shows a power level difference between original signal $S_R$ measured at the antenna 101 with the power level of signal $S_1$ measured by the measurement block 106. Ordinate corresponds to aforementioned error $E_s$ as described in FIG. 2.

Let's take an example to illustrate the different elements of FIG. 3 where it is considered that ADC 108 is limiting the receiver 100, thus provoking the clipping phenomenon on signal $S_1$. It is known that ADC dynamic range is six times its bitwidth. Hence, a 10-bit ADC has a dynamic range of 60 dB, meaning that the clipping power level is at 60 dB. Referring to FIG. 3 in the abscissa, if the dynamic range of signal $S_1$ is 5 dB below the clipping power level (i.e. 60−5=55 dB), it means that $S_1$ is represented in average by 9.16 bits (i.e. 55/6=9.16). In this case, ADC 108 slowly starts to clip and by looking at the ordinate, it can be seen that the error is quite small, round about 1 dB. Therefore, the signal as it should be seen by AGC circuit 110 should be equal to 55+1=56 dB instead of 55 dB as originally measured due to clipping condition. Furthermore, if the dynamic range of signal $S_1$ is 1 dB below the clipping power level (i.e. 60−59=1 dB), it means that $S_1$ is represented in average by 9.83 bits (i.e. 59/6=9.83). In this case, ADC 108 is almost completely clipped at its full scale and by looking at the ordinate, it can be seen that the error is quite big, round about 10 dB. Therefore, the signal as it should be seen by AGC circuit 110 should be equal to 59+10=69 dB instead of 59 dB as originally measured due to clipping condition.

Figure 4:
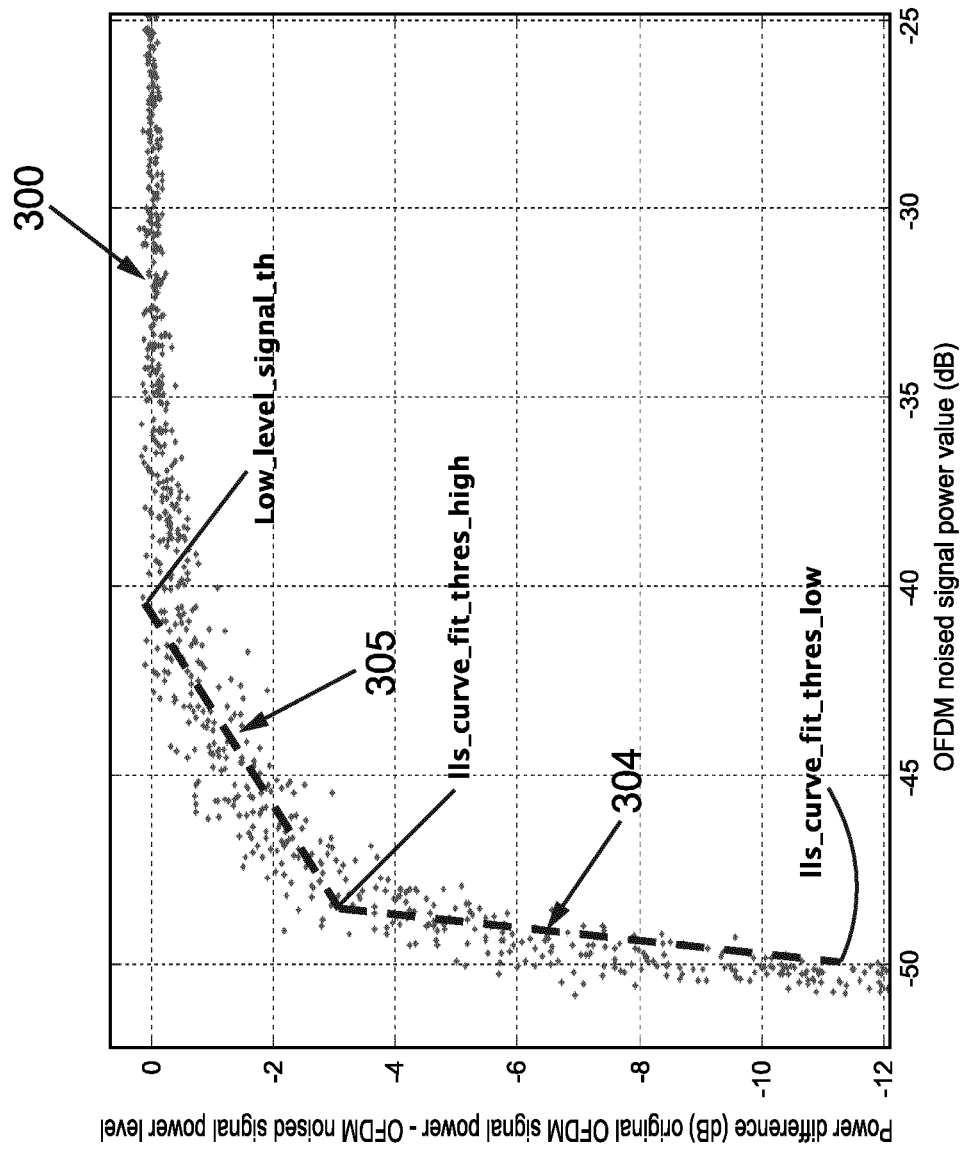
FIG. 4 is a graph illustrating an exemplary characterization curve at low limit of an input dynamic range.

Referring to FIG. 4, there is shown a graph illustrating an exemplary characterization curve 300 of white Gaussian signals below a jamming threshold. A curve fitting using the Least-Squares method is also shown comprising two line segments 304,305. Abscissa of the graph, expressed in dB, shows the power level of signal $S_4$ measured by the measurement block 107. Ordinate of the graph, expressed also in dB, shows a power level difference between original signal $S_R$ measured at the antenna 101 level with the power level of signal $S_4$ measured by the measurement block 107. Ordinate corresponds to aforementioned error $E_s$ as described in FIG. 2.

Let's take an example to illustrate the different elements of FIG. 4 where it is considered that noise floor is provoking the jamming phenomenon on signal $S_4$. Referring to FIG. 4 in the abscissa, if the power level of signal $S_4$ is at −45 dB, it means that $S_4$ slowly starts to be jammed by noise floor and by looking at the ordinate, it can be seen that the error is quite small, round about −2 dB. Therefore, the signal as it should be seen by AGC circuit 110 should be equal to −45−2=−47 dB instead of −45 dB as originally measured due to jamming condition. Furthermore, if the power level of signal $S_4$ is at −48 dB, it means that $S_4$ is almost completely jammed by the noise level and by looking at the ordinate, it can be seen that the error is quite, big round about −6 dB. Therefore, the signal as it should be seen by AGC circuit 110 should be equal to −48−6=−54 dB instead of −48 dB as originally measured due to jamming condition.

Figure 5:
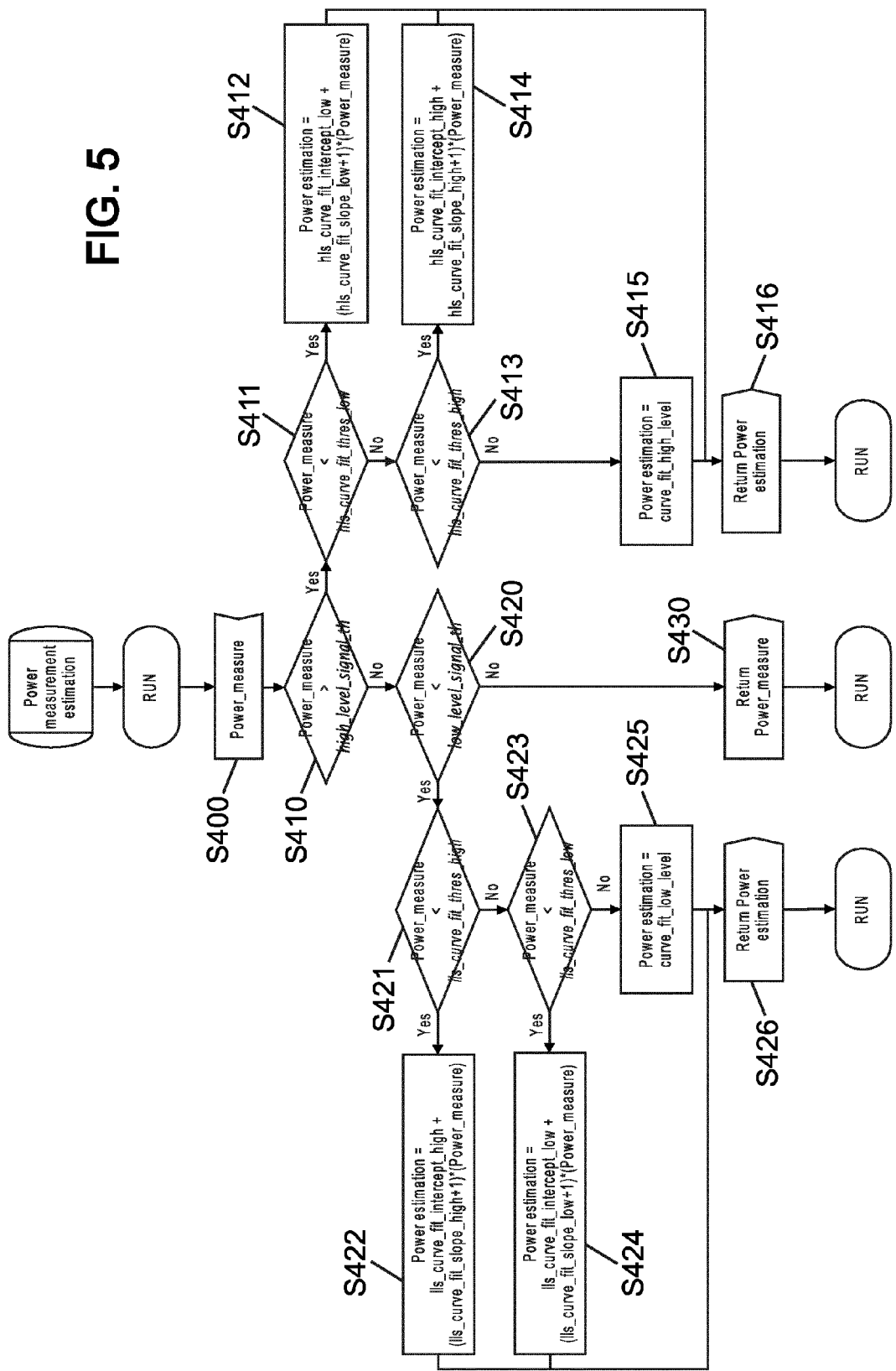
FIG. 5 is a flow diagram illustrating embodiments of the proposed solution.

FIG. 5 is a flow diagram illustrating possible embodiments of the proposed method consistent with the embodiments of the device already described above with FIG. 3 and FIG. 4. Depending on the embodiment, additional steps may be added, others removed, and the ordering of the steps rearranged.

Referring to FIG. 5, in step S400, a value Power_measure corresponding to a power level of a signal is obtained by measurements performed at a point of measurement such as those described with reference to FIG. 1. In step S410, the value Power_measure is compared to the high_level_signal_th threshold corresponding to a threshold above which clipping is considered to be existing as depicted in FIG. 3. If value Power_measure is greater than high_level_signal_th, then in step S411, value Power_measure is compared to another threshold hls_curve_fit_thres_low corresponding to the point of intersection of the two line segments 204 and 205 of the curve fitting of the characterization curve 200. If the value Power_measure is lower than hls_curve_fit_thres_low, then in step S412, a power estimation is computed thanks to the equation of line segment 204 comprising an intercept hls_curve_fit_intercept_low and a slope hls_curve_fit_slope_low, using the following formula (2):

$$\text{Power\_estimation} = hls\_\text{curve\_fit\_intercept\_low} + (lls\_\text{curve\_fit\_slope\_low} + 1) * \text{Power\_measure} \quad (2)$$

Afterwards, in step S416, values Power_estimation is returned and the algorithm stops.

In step S411, if the value Power_measure is not lower than hls_curve_fit_thres_low, then in a step S413, value Power_measure is compared to hls_curve_fit_thres_high where hls_curve_fit_thres_high is the point of line segment 205 corresponding to highest level of clipping. If value Power_measure is lower than hls_curve_fit_thres_high, then in step S414, a power estimation is computed thanks to the equation of line segment 205 comprising an intercept hls_curve_fit_intercept_high and a slope hls_curve_fit_slope_high using the following formula (3):

$$\text{Power\_estimation} = hls\_\text{curve\_fit\_intercept\_high} + (hls\_\text{curve\_fit\_slope\_high} + 1) * \text{Power\_measure} \quad (3)$$

Afterwards, in step S416, value Power_estimation is returned and the algorithm stops.

In step S410, if value Power_measure is not lower than high_level_signal_th, then in step S420, Power_measure is further compared to low_level_signal_th corresponding to a threshold below which jamming is considered to be existing as depicted in FIG. 4.

If value Power_measure is not lower than low_level_signal_th, then it is considered that value Power_measure is neither below the jamming threshold nor above the clipping threshold. Thus, in step S430, no power estimation is needed and Power_measure is returned before the algorithm stops.

If value Power_measure is lower than low_level_signal_th, then in step S421, value Power_measure is compared to lls_curve_fit_thres_high corresponding to the point of intersection of the two line segments 304 and 305 of the curve fitting of the characterization curve 300. If value Power_measure is lower than threshold lls_curve_fit_thres_high, then in step S422, a power estimation is computed thanks to the equation of line segment 304 comprising an intercept lls_curve_fit_intercept_high and a slope lls_curve_fit_slope_high, using the following formula (4):

$$\text{Power\_estimation} = lls\_\text{curve\_fit\_intercept\_high} + (lls\_\text{curve\_fit\_slope\_high} + 1) * \text{Power\_measure} \quad (4)$$

Afterwards, in step S426, value Power_estimation is returned and the algorithm stops.

In step S421, if value Power_measure is not lower than lls_curve_fit_thres_high, then in a step S423, value Power_measure is compared to lls_curve_fit_thres_low where lls_curve_fit_thres_low is the point of line segment 305 corresponding to highest level of jamming. If value Power_measure is lower than lls_curve_fit_thres_low, then in step S424, a power estimation is computed thanks to the equation of line segment 305 comprising an intercept lls_curve_fit_intercept_low and a slope lls_curve_fit_slope_low using the following formula (5):

$$\text{Power\_estimation} = lls\_\text{curve\_fit\_intercept\_low} + (lls\_\text{curve\_fit\_slope\_low} + 1) * \text{Power\_measure} \quad (5)$$

Afterwards, in step S426, Power_estimation is returned and the algorithm stops.

In the claims, the word "comprising" does not exclude other elements or steps, and the indefinite article "a" or "an" does not exclude a plurality. A single unit may fulfil the functions of several items recited in the claims. The mere fact that different features are recited in mutually different dependent claims does not indicate that a combination of these features cannot be advantageously used. Any reference signs in the claims should not be construed as limiting the scope of the proposed solution.

The invention claimed is:

1. A method of setting a Radiofrequency, RF, signal level in a RF receiver comprising:
    estimating an error of the signal level due to signal level reaching a condition of jamming or clipping by correlating the signal level with a predetermined point of a single characterization curve of jamming condition or with a predetermined point of a single characterization curve of clipping condition, respectively;
    correcting the RF signal level based on the error; and, wherein:
    each of the single characterization curve of jamming condition or the single characterization curve of clipping condition comprises a plurality of points comprising first points determined in a previously performed characterization at a point of measurement and groups of second points stepped between pairs of adjacent first points, said plurality of first points including at least three points defining at least two sections of the single characterization curve.

2. The method of claim 1, wherein the plurality of points of the single characterization curve is stored in a look-up table.

3. The method of claim 1, wherein the groups of second points of the single characterization curve are obtained from the first points using a curve fitting algorithm.

4. The method of claim 3, wherein the curve fitting algorithm is based on an approximation method wherein the approximation method is a Least-Squares method.

5. The method of claim 3, wherein the curve fitting algorithm is based on an interpolation method wherein the interpolation method is a Cubic Spline, Lagrange or Newton interpolation method.

6. The method of claim 1, wherein correcting the RF signal level based on the error is performed before analog-to-digital converting said RF signal.

7. The method of claim 1, further comprising:
   obtaining a measured RF signal level reaching a condition of jamming or clipping at the output of a signal processing system wherein the signal processing system is an Analog to Digital Converter;
   estimating the RF signal level based on at least the measured RF signal level and a sum of known gain values associated to the measured RF signal.

8. An apparatus for setting a Radiofrequency, RF, signal level in a RF receiver comprising:
   a correlating unit configured to estimate an error of the signal level due to signal level reaching a condition of jamming or clipping by correlating the signal level with a predetermined point of a single characterization curve of jamming condition or with a predetermined point of a single characterization curve of clipping condition, respectively;
   a correcting unit configured to correct the RF signal level based on the error; and, wherein:
   each of the single characterization curve of lamming condition or the single characterization curve of clipping condition comprises a plurality of points comprising first points determined in a previously performed characterization at a point of measurement and groups of second points stepped between pairs of adjacent first points, said plurality of first points including at least three points defining at least two sections of the single characterization curve.

9. The apparatus of claim 8, wherein the plurality of points of the single characterization curve is stored in a look-up table.

10. The apparatus of claim 8, wherein the groups of second points of the single characterization curve are obtained from the first points using a curve fitting algorithm.

11. The apparatus of claim 10, wherein the curve fitting algorithm is based on an approximation method wherein the approximation method is a Least-Squares method.

12. The apparatus of claim 10, wherein the curve fitting algorithm is based on an interpolation method wherein the interpolation method is a Cubic Spline, Lagrange or Newton interpolation method.

13. The apparatus of claim 8, wherein correcting the RF signal level based on the error is performed before analog-to-digital converting said RF signal.

14. The apparatus of claim 8, further comprising:
    an estimation unit configured to estimate the RF signal level based on at least a measured RF signal level reaching a condition of jamming or clipping at the output of a signal processing system wherein the signal processing system is an Analog to Digital Converter and a sum of known gain values associated to the measured RF signal.

15. A receiver for a wireless device comprising the apparatus of claim 8.

16. A wireless device comprising the receiver of claim 15.

* * * * *